United States Patent
Oh et al.

(10) Patent No.: US 12,259,647 B2
(45) Date of Patent: Mar. 25, 2025

(54) METHOD OF MANUFACTURING EXTREME ULTRAVIOLET (EUV) PHOTOMASK AND METHOD AND APPARATUS FOR CORRECTING EUV PHOTOMASK

(71) Applicant: SAMSUNG ELECTRONICS CO., LTD., Suwon-si (KR)

(72) Inventors: Jongkeun Oh, Seoul (KR); Sanguk Park, Yongin-si (KR); Gyeongcheon Jo, Hwaseong-si (KR); Jongju Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 742 days.

(21) Appl. No.: 17/371,375

(22) Filed: Jul. 9, 2021

(65) Prior Publication Data

US 2022/0113619 A1    Apr. 14, 2022

(30) Foreign Application Priority Data

Oct. 14, 2020 (KR) .................. 10-2020-0132574

(51) Int. Cl.
  *G03F 1/24*      (2012.01)
  *H01L 21/027*    (2006.01)

(52) U.S. Cl.
  CPC ............ *G03F 1/24* (2013.01); *H01L 21/0274* (2013.01)

(58) Field of Classification Search
  CPC ............................. G03F 1/24; H01L 21/0274
  See application file for complete search history.

(56) References Cited

U.S. PATENT DOCUMENTS

| | | | |
|---|---|---|---|
| 8,613,803 B2 | 12/2013 | LeClaire et al. | |
| 10,029,332 B2 | 7/2018 | Kim et al. | |
| 2009/0114619 A1 | 5/2009 | Sotoaka et al. | |
| 2011/0027993 A1* | 2/2011 | Moon | G03F 7/40 438/689 |
| 2015/0348852 A1 | 12/2015 | Pilch | |
| 2017/0059984 A1 | 3/2017 | Kim et al. | |
| 2018/0188654 A1* | 7/2018 | Rowell | G03F 7/40 |
| 2020/0208251 A1 | 7/2020 | Sato et al. | |
| 2021/0389661 A1* | 12/2021 | Shih | G03F 1/24 |

FOREIGN PATENT DOCUMENTS

| | | |
|---|---|---|
| JP | 6-260477 A | 9/1994 |
| KR | 10-1082093 B1 | 11/2011 |
| KR | 10-1109268 B1 | 1/2012 |

* cited by examiner

*Primary Examiner* — Victor A Mandala
*Assistant Examiner* — Colleen E Snow
(74) *Attorney, Agent, or Firm* — Sughrue Mion, PLLC

(57) ABSTRACT

A method is provided. The method includes preparing a mask blank, the mask blank including a substrate, a reflective layer disposed on the substrate for reflecting extreme ultraviolet light, and a light absorbing layer disposed on the reflective layer; providing a photomask by forming a plurality of pattern elements having a target critical dimension from the light absorbing layer, wherein the plurality of pattern elements include a correction target pattern element to be corrected, and the correction target pattern element has a critical dimension different from the target critical dimension; identifying a correction target area of the photomask in which the correction target pattern element is disposed; applying an etchant to the photomask; and irradiating a laser beam to the correction target area while the etchant is provided on the photomask.

19 Claims, 13 Drawing Sheets

METHOD OF MANUFACTURING EXTREME ULTRAVIOLET (EUV) PHOTOMASK AND METHOD AND APPARATUS FOR CORRECTING EUV PHOTOMASK

CROSS-REFERENCE TO RELATED APPLICATION(S)

This application claims priority from Korean Patent Application No. 10-2020-0132574, filed on Oct. 14, 2020 in the Korean Intellectual Property Office, the disclosure of which is incorporated herein by reference in its entirety.

BACKGROUND

Devices, methods and systems consistent with example embodiments relate to a manufacturing an extreme ultraviolet (EUV) photomask, and more particularly, a method and an apparatus for locally correcting a critical dimension of an EUV photomask, a method of manufacturing a photomask, and a method of manufacturing a semiconductor device using the same.

As integration and miniaturization of semiconductor devices increase, a technique for configuring circuit patterns of a semiconductor device with a smaller size has been necessary. To meet the technical demand therefor, a wavelength of a light source used in a photolithography process has decreased.

Recently, EUV photolithography using EUV as a light source has been suggested. Because most EUV is absorbed by refractive optical materials, a general EUV photolithography process may use an EUV photomask including a reflective optical system rather than a refractive optical system.

SUMMARY

One or more example embodiments provide a method of manufacturing an EUV photomask.

One or more example embodiments provide a method and an apparatus for locally correcting a critical dimension of an EUV photomask.

According to an example embodiment, a method includes preparing a mask blank, the mask blank including a substrate, a reflective layer disposed on the substrate for reflecting extreme ultraviolet light, and a light absorbing layer disposed on the reflective layer; providing a photomask by forming a plurality of pattern elements having a target critical dimension from the light absorbing layer, wherein the plurality of pattern elements include a correction target pattern element to be corrected, and the correction target pattern element has a critical dimension different from the target critical dimension; identifying a correction target area of the photomask in which the correction target pattern element is disposed; applying an etchant to the photomask; and irradiating a laser beam to the correction target area while the etchant is provided on the photomask.

According to an example embodiment, a method includes preparing a mask blank, the mask blank including a substrate, a reflective layer disposed on the substrate for reflecting extreme ultraviolet light, and a light absorbing layer disposed on the reflective layer; providing a photomask by forming a plurality of pattern elements having a first width from the light absorbing layer, wherein the plurality of pattern elements include correction target pattern elements to be corrected, and the correction target pattern elements have a second width greater than the first width; identifying a correction target area of the photomask in which the correction target pattern elements are disposed; applying a chemical liquid to the photomask; and irradiating a laser beam having a wavelength between 200 nm and 700 nm to the correction target area while the chemical liquid is provided on the photomask. In the irradiating the laser beam to the correction target area, the correction target pattern elements are etched by the chemical liquid to reduce deviation of the second width from the first width.

According to an example embodiment, a method includes preparing a photomask including a substrate, a reflective layer disposed on the substrate for reflecting extreme ultraviolet light, and a plurality of pattern elements formed of a light absorber, wherein the plurality of pattern elements include a correction target pattern element which has a width greater than a width of a target pattern; identifying a correction target area of the photomask in which the correction target pattern element is disposed; applying a chemical liquid to the photomask; and irradiating a laser beam to the correction target area while the chemical liquid is provided on the photomask. In the irradiating the laser beam to the correction target area, the correction target pattern element is etched by the chemical liquid to reduce deviation of the width of the correction target pattern element from the width of the target pattern.

According to an example embodiment, an apparatus includes a support configured to support a photomask having an upper surface on which a plurality of pattern elements are arranged; a chemical supplier configured to supply a chemical liquid to the upper surface of the photomask; a laser configured to irradiate a laser beam to a partial area of the upper surface of the photomask; and a controller configured to control the chemical supplier and the laser. The controller is configured to identify a correction target area from among the plurality of pattern elements in which correction target pattern elements have a critical dimension different from a target critical dimension, and drive the laser to irradiate the laser beam to the correction target area while the chemical liquid is provided on the photomask.

According to an example embodiment, a method includes providing a wafer including a feature layer; forming a photoresist film on the feature layer; preparing a photomask including a substrate, a reflective layer disposed on the substrate for reflecting extreme ultraviolet light, and a plurality of pattern elements formed of a light absorber, wherein the plurality of pattern elements include a correction target pattern element which has a pattern width different from a target pattern width; correcting a critical dimension of the correction target pattern element by irradiating a laser beam to a correction target area of the photomask corresponding to the correction target pattern element while a chemical liquid is provided on the photomask; exposing the photoresist film using the photomask; forming a photoresist pattern by developing the photoresist film; and processing the feature layer using the photoresist pattern.

BRIEF DESCRIPTION OF DRAWINGS

The above and other aspects and features will be more clearly understood from the following detailed description of example embodiments, taken in conjunction with the accompanying drawings, in which.

DETAILED DESCRIPTION

Hereinafter, example embodiments will be described as follows with reference to the accompanying drawings.

Figure 1:
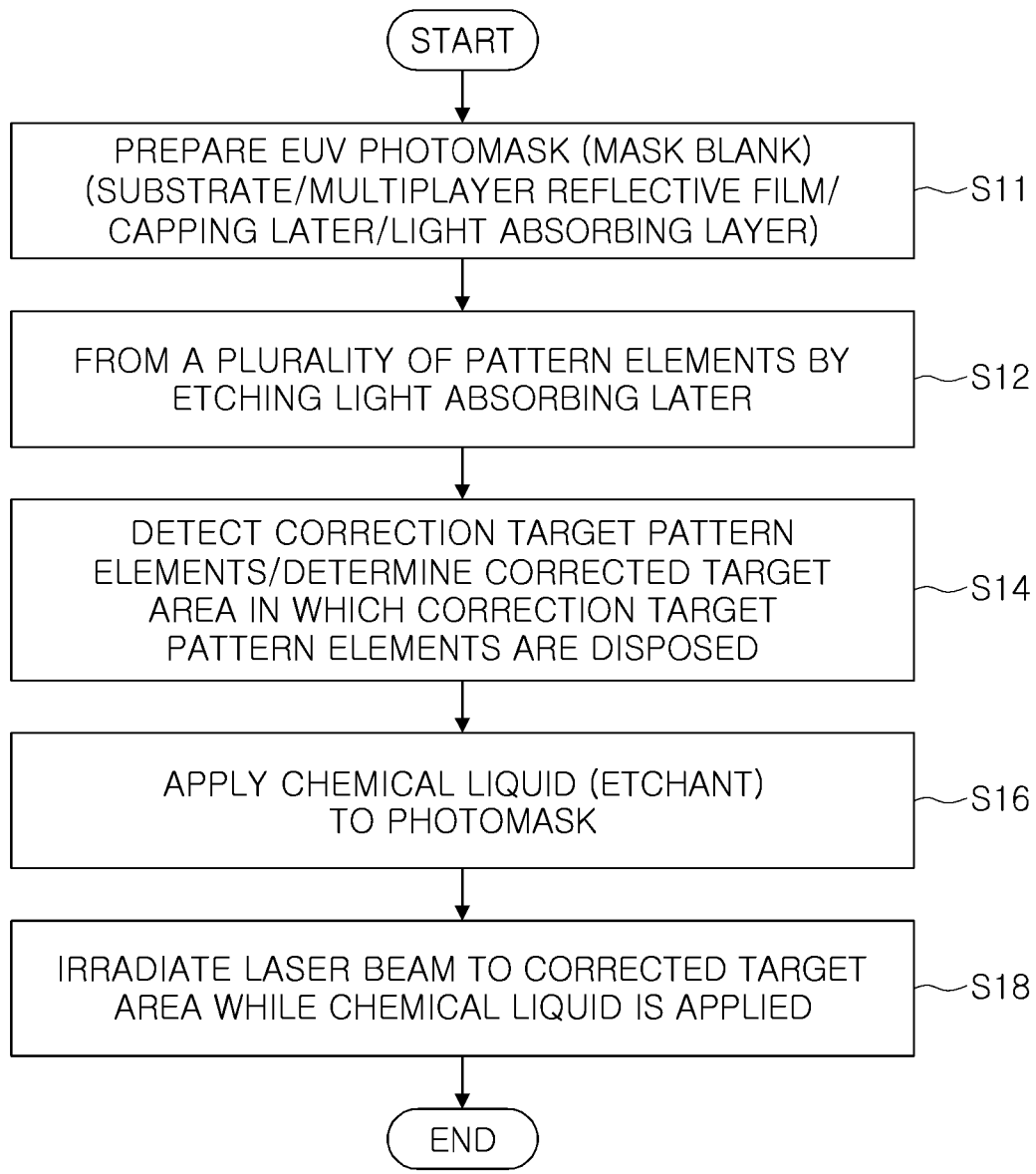
FIG. 1 is a flowchart illustrating a method of manufacturing an EUV photomask according to an example embodiment.

FIG. 1 is a flowchart illustrating a method of manufacturing an EUV photomask according to an example embodiment.

Referring to FIG. 1, a method of manufacturing a photomask in an example embodiment may include a process S11 of preparing a mask blank. An example of the mask blank introduced in the process S11 is illustrated in FIG. 2.

Figure 2:
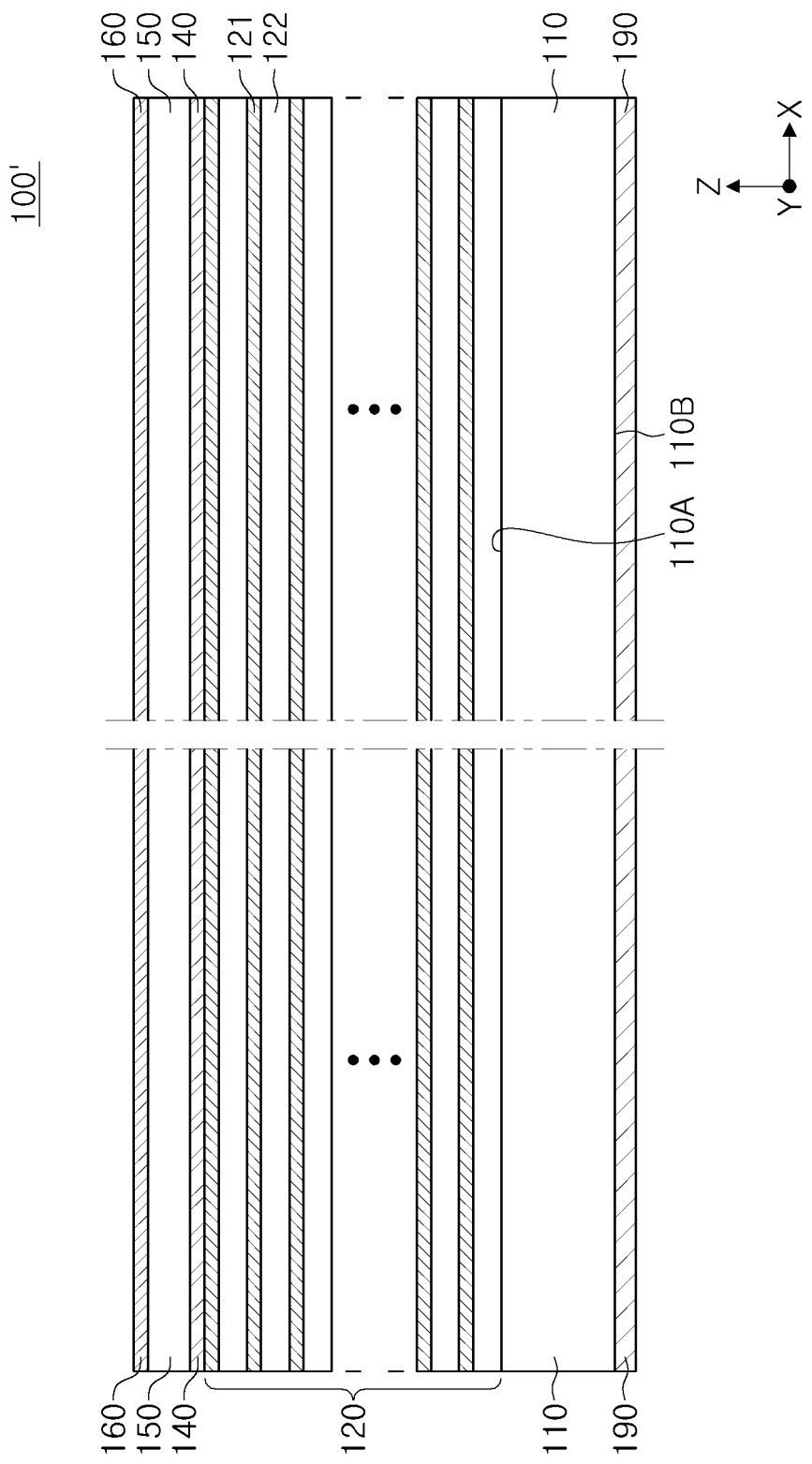
FIG. 2 is a cross-sectional diagram illustrating an example of a blank of an EUV photomask.

Referring to FIG. 2, a mask blank 100' may include a mask substrate 110, a reflective layer 120, a capping layer 140, and a light absorbing layer 150 disposed in order on a first surface 110A of the mask substrate 110. The mask blank 100' in an example embodiment may be configured as a mask blank for a reflective photomask.

The mask substrate 110 may include a dielectric material, glass, a semiconductor material, or a metallic material. In example embodiments, the mask substrate 110 may include a material having a low thermal expansion coefficient. For example, the mask substrate 110 may have a thermal expansion coefficient of about $0\pm1.0\times10^{-7}/°$ C. at 20° C. Also, the mask substrate 110 may be formed of a material having excellent smoothness and flatness, and excellent resistance against a cleaning liquid.

For example, the mask substrate 110 may include a synthetic quartz glass, quartz glass, aluminosilicate glass, soda lime glass, low thermal expansion material (LTEM) glass such as $SiO_2$—$TiO_2$-based glass, crystallized glass obtained by precipitating a β quartz solid solution material, single crystal silicon, or SiC.

The mask substrate 110 may have a first surface 110A and a second surface 110B disposed to oppose each other. In example embodiments, the first surface 110A may have a flatness of about 50 nm or less, and the second surface 110B may have a flatness of about 500 nm or less. For example, each of the first surface 110A and the second surface 110B of the mask substrate 110 may have a root mean square (RMS) surface roughness of about 0.15 nm or less, but example embodiments are not limited thereto.

The reflective layer 120 may be disposed on the first surface 110A of the mask substrate 110. The reflective layer 120 may be configured to reflect EUV light. The reflective layer 120 may include a Bragg reflector in which a first material layer 121 having a high refractive index and a second material layer 122 having a low refractive index are alternately stacked multiple times. The first and second material layers 121 and 122 may be repeatedly formed about 20 to 60 times to form a reflective layer that includes 40 to 120 layers. For example, the reflective layer 120 may include a molybdenum (Mo)/silicon (Si) periodic multilayer, a Mo compound/Si compound periodic multilayer, a ruthenium (Ru)/Si periodic multilayer, and a beryllium (Be)/Mo periodic multilayer, a Si/niobium (Nb) periodic multilayer, a Si/Mo/Ru periodic multilayer, a Si/Mo/Ru/Mo periodic multilayer, or a Si/Ru/Mo/Ru periodic multilayer.

The material of the first and second material layers 121 and 122, and a film thickness of each of the first and second material layers 121 and 122 may be adjusted according to a wavelength band of the applied EUV light or a reflectivity of EUV light required for the reflective layer 120. In example embodiments, the reflective layer 120 for the EUV mask blank 100' may include a molybdenum (Mo)/silicon (Si) periodic multilayer. For example, the first material layer 121 may be formed of molybdenum or silicon, and the second material layer 122 may be formed of silicon or molybdenum.

The reflective layer 120 may be formed using a DC sputtering process, an RF sputtering process, or an ion beam sputtering process, but example embodiments are not limited thereto. For example, when a Mo/Si periodic multilayer is formed using the ion beam sputtering, the Si film and the Mo film may be alternately formed with a cycle in which an Si film is deposited using an Si target as a target and an Ar gas as a sputtering gas, and an Mo film is deposited using an Mo target as a target and an Ar gas as a sputtering gas.

The capping layer 140 may be configured to protect the reflective layer from mechanical and/or chemical damages. For example, the capping layer 140 may include ruthenium (Ru) or a ruthenium compound. The ruthenium compound may be formed of a compound including ruthenium (Ru) and any one or any combination of Nb, Zr, Mo, Y, B and La. For example, the capping layer 140 may have a thickness of 5 to 100 Å.

The light absorbing layer 150 may include a material that absorbs EUV light and has a low EUV light reflectivity. Also, the light absorbing layer 150 may include a material having excellent chemical resistance. In example embodiments, the light absorbing layer 150 may include a material having a maximum light reflectivity of about 5% or less in the vicinity of a wavelength of 13.5 nm when light in the EUV wavelength range is irradiated onto a surface of the light absorbing layer 150. For example, the light absorbing layer 150 may include any one or any combination of TaN, TaHf, TaHfN, TaBSi, TaBSiN, TaB, TaBN, TaSi, TaSiN, TaGe, TaGeN, TaZr and TaZrN. In example embodiments, the light absorbing layer 150 may be implemented by a tantalum boron nitride (TaBN) layer or a tantalum boron oxide (TaBO) layer. For example, a sputtering process may be used to form the light absorbing layer 150, but example embodiments are not limited thereto. In example embodiments, the light absorbing layer 150 may have a thickness of about 30 to 200 nm.

The anti-reflective film 160 may provide a relatively low reflectivity in a wavelength band of inspection light, for example a wavelength band of about 190 to 260 nm, during inspection of pattern elements to be manufactured in a subsequent process, thereby obtaining sufficient contrast. For example, the anti-reflective film 160 may include a metal nitride, such as titanium nitride or tantalum nitride, or may further include at least one additional component selected from a group consisting of chlorine, fluorine, argon, hydrogen, and oxygen. For example, the anti-reflective layer 160 may be formed by a sputtering process, but example embodiments are not limited thereto. For example, the anti-reflective layer 160 may have a thickness of 5 to 25 nm. In example embodiments, the anti-reflective layer 160 may be formed by processing the surface of the light absorbing layer 150 in an atmosphere containing the additional component or a precursor thereof.

Backside conductive layer 190 may be disposed on the second surface 110B of the mask substrate 110. The backside conductive film 190 may be fastened to an electrostatic chuck of a lithographic apparatus during a photolithography process (see FIG. 12). The backside conductive layer 190 may include a material containing chromium (Cr) or a material containing tantalum (Ta) having conductivity. For example, the backside conductive layer 190 may be formed of any one or any combination of Cr, CrN, and TaB. Alternatively, the backside conductive layer 190 may include a metal oxide or metal nitride having conductivity. For example, the backside conductive layer 190 may include any one or any combination of titanium nitride (TiN), zirconium nitride (ZrN), hafnium nitride (HfN), ruthenium oxide ($RuO_2$), zinc oxide ($ZnO_2$), and iridium oxide ($IrO_2$).

In example embodiments, the mask blank 100' may not include a portion of the elements or may further include another element. For example, the anti-reflective layer 160 and/or the capping layer 140 may not be included in the mask blank 100'. In a process of forming a pattern element S12, while the light absorbing layer 150 is dry-etched, the mask blank 100' may further include a buffer layer for protecting the reflective layer 120 from being damaged. The buffer layer may be formed of a material having a low rate of EUV light absorption.

Referring back to FIG. 1, in the process S12, a photomask having a plurality of pattern elements may be formed by etching the light absorbing layer. An example of the photomask 100 provided in the process S12 is illustrated in FIGS. 3, 4A and 4B.

In an example embodiment, a plurality of pattern elements PE may be formed by etching the anti-reflective layer 160 together with the light absorbing layer 150.

Figure 3:
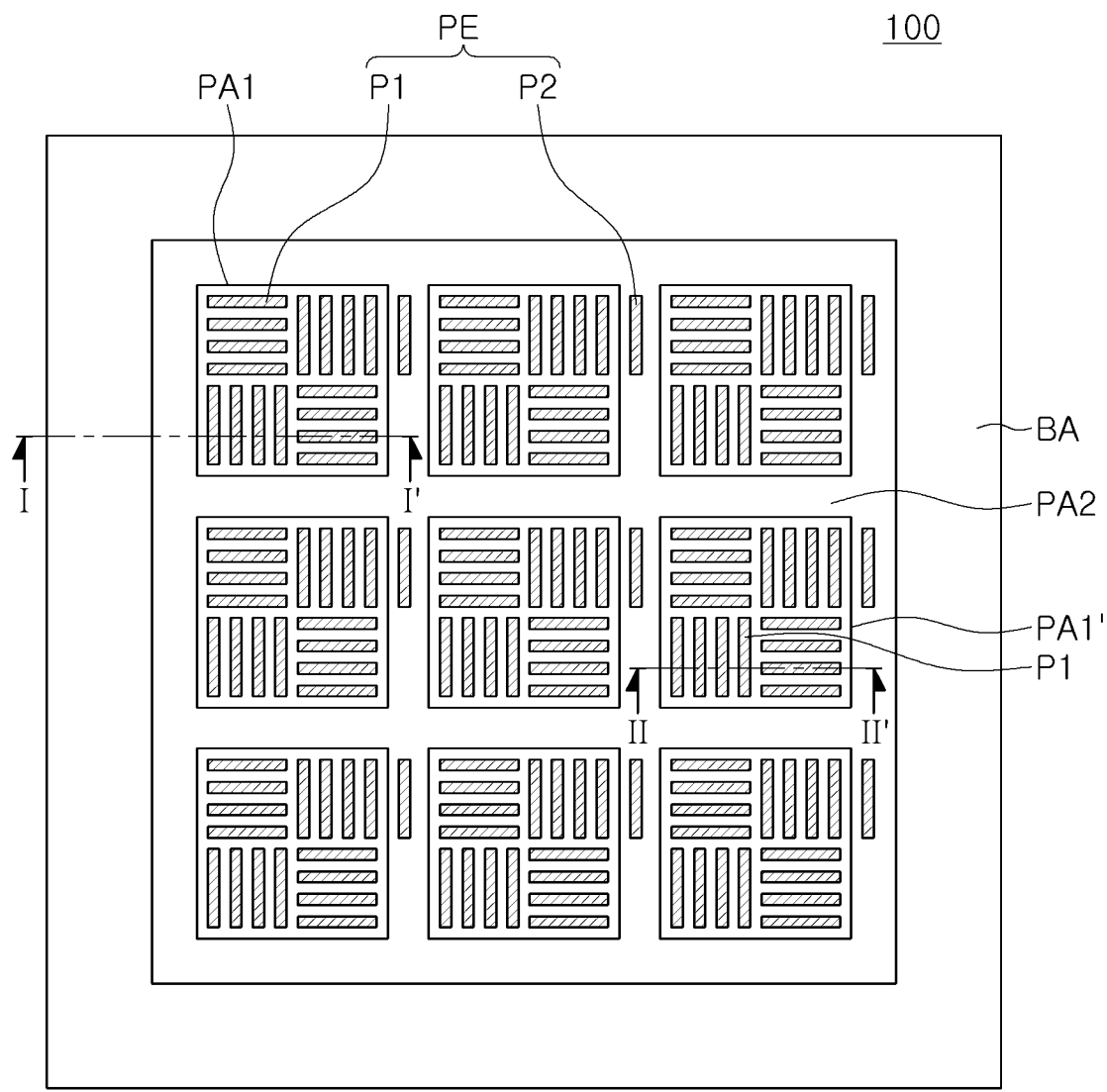
FIG. 3 is plan diagram illustrating an EUV photomask before being locally corrected.
Figure 4A:
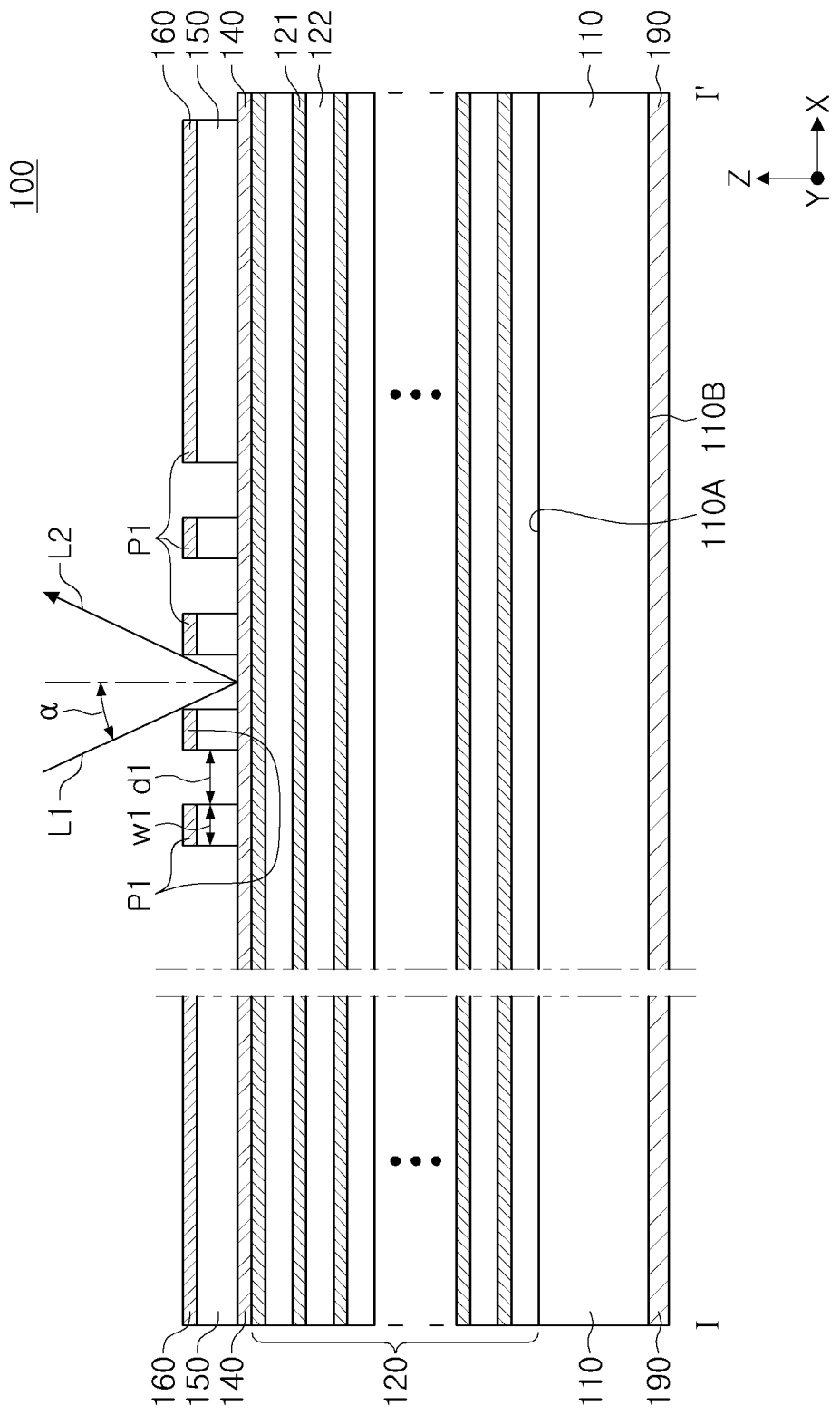
FIGS. 4A and 4B are cross-sectional diagrams illustrating the EUV photomask illustrated in FIG. 2 taken along lines IT and II-IF, respectively.
Figure 4B:
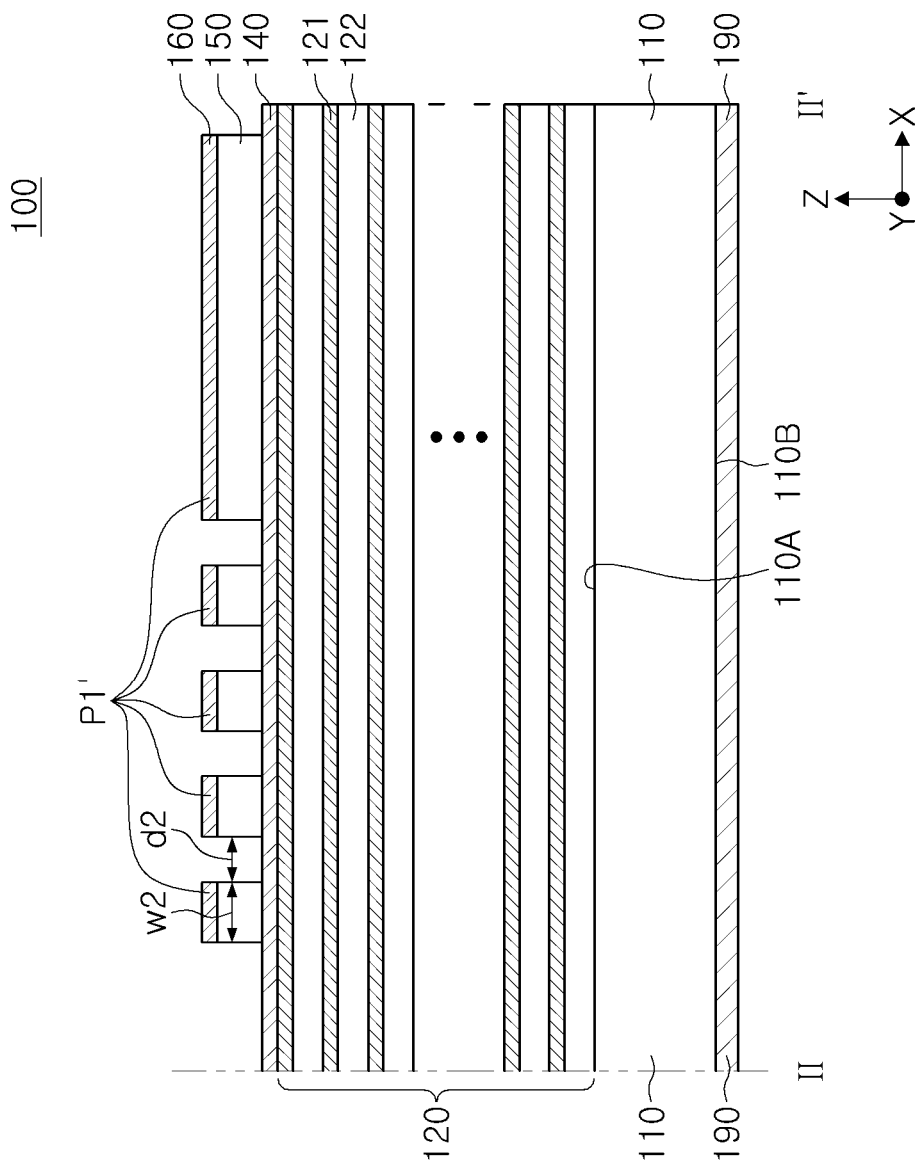

Referring to FIGS. 3 and 4A, the photomask 100 illustrated in an example embodiment may be divided into a pattern area PE and a non-pattern area. The pattern area of the photomask 100 may include a main pattern area PA1 in which the main pattern elements P1 are arranged, and an auxiliary pattern area PA2 in which the auxiliary pattern elements P2 are arranged. A border area BA surrounding the main pattern area PA1 and the auxiliary pattern area PA2 may be configured as the non-pattern area.

The plurality of pattern elements PE may include main pattern elements P1 and auxiliary pattern elements P2. In the EUV lithography system (see FIG. 12), the main pattern elements P1 may be configured to transfer a pattern for forming a unit element including an integrated circuit to a chip area on a wafer, and the auxiliary pattern elements P2 may be configured to transfer an auxiliary pattern to a scribe lane area on the wafer. For example, the auxiliary pattern elements P2 may include auxiliary pattern elements (e.g., an align key pattern) which may be necessary in the process of manufacturing the integrated circuit device and may not remain in a final integrated circuit device.

The arrangement illustrated in FIG. 3 is provided for ease of description and illustration, and example embodiments are not limited thereto. In example embodiments, a portion of the plurality of main pattern areas PA1 may be configured as a non-pattern area in which the main pattern element P1 is not formed, and a portion of the main pattern areas PA1 may include pattern elements different from those of the other main pattern areas.

Light L1 (e.g., an EUV beam) incident in an EUV lithography system (see FIG. 12) may be projected toward the photomask 100 at an incident angle α with a vertical axis perpendicular to the surface of the photomask 100. In example embodiments, the incident angle α may range from about 5° to about 7°. The reflected light L2 may be projected toward a projection optical system (see FIG. 12) and may perform EUV lithography. In example embodiments, the photomask 100 may be configured as a reflective photomask which may be used in an EUV lithography process using an EUV wavelength range, an exposure wavelength of about 13.5 nm, for example. The EUV lithography process using a photomask will be described in greater detail with reference to FIGS. 12 and 13.

The plurality of pattern elements PE may be configured to have a desired target critical dimension. The target critical dimension may be expressed by a dimension of the pattern elements PE and a distance between adjacent pattern elements. For example, a critical dimension uniformity (CDU) of the photomask 100 may determine a critical dimension uniformity of patterns implemented on a wafer through a lithography process. In particular, the main pattern elements P1 for a unit element included in the integrated circuit may require high uniformity.

The plurality of pattern elements PE may include pattern elements having a critical dimension different from the target critical dimension depending on distribution of a process set. A portion of the pattern elements having different critical dimensions may include "pattern elements to be corrected", and theses pattern elements are called correction target pattern elements.

Referring back to FIG. 1, in process S14, the correction target pattern elements may be detected, and a correction target area in which the correction target pattern elements are arranged may be determined.

In an example embodiment, among the pattern elements having a critical dimension different from the target critical dimension among the plurality of pattern elements PE (in particular, the main pattern elements P1), pattern elements deviated from an allowable range may be determined as "correction target pattern elements P1'" to be corrected according to the deviation of the critical dimension. The correction target pattern elements P1' may be locally distributed over an entire area of the photomask 100. Also, the pattern elements P1' to be corrected may have different distributions depending on processes, and may have a different distribution for each photomask.

For example, referring to FIG. 4B, the correction target pattern elements P1' may be pattern elements arranged in a portion of the main pattern areas PA1 in FIG. 3, and may be correction target pattern elements, which deviate from an allowable range according to the deviation of the critical dimension. The correction target pattern elements P1' may have a width w2 greater than a width w1 of the main pattern elements P1 illustrated in FIG. 4A, and may have a distance d2 smaller than a distance d1. The correction target pattern area PA1' in which the correction target pattern elements P1' are disposed may be determined as a correction target area.

It has been described that the correction target area may be selected for each main pattern area with reference to the photomask illustrated in FIGS. 3 and 4B, and alternatively, the correction target area may be determined depending on a distribution of the critical dimension of each area throughout the entire area of the photomask.

Figure 5:
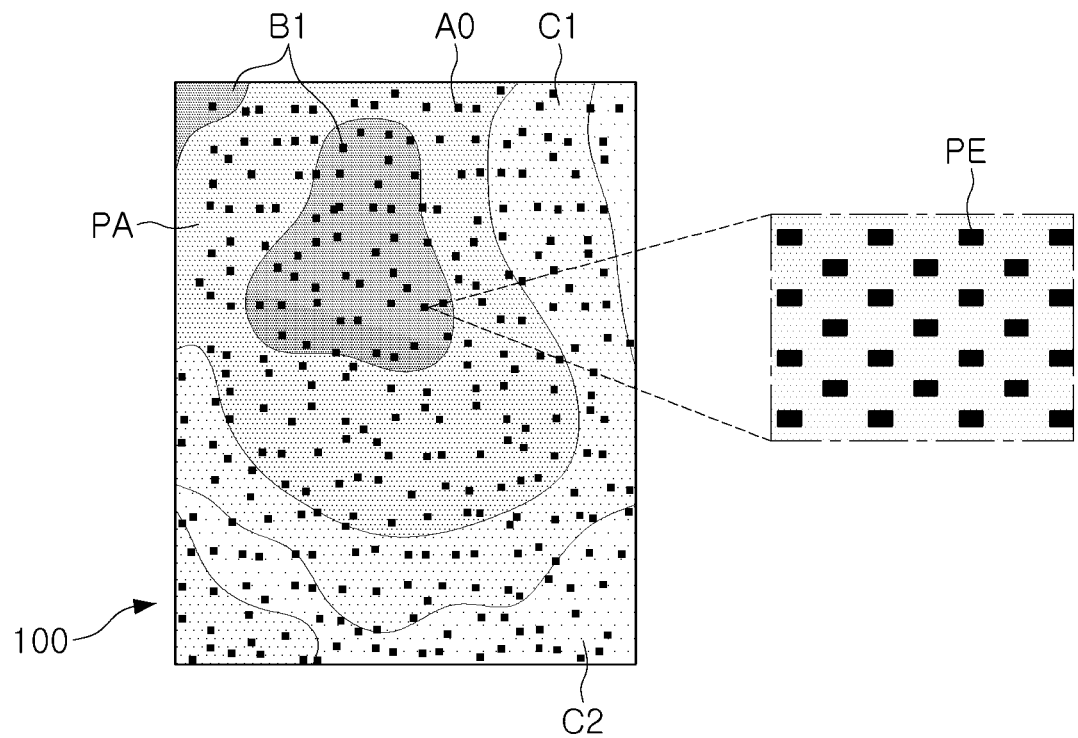
FIG. 5 is a plan diagram illustrating a critical dimension gradient of pattern elements of a photomask.
Figure 6:
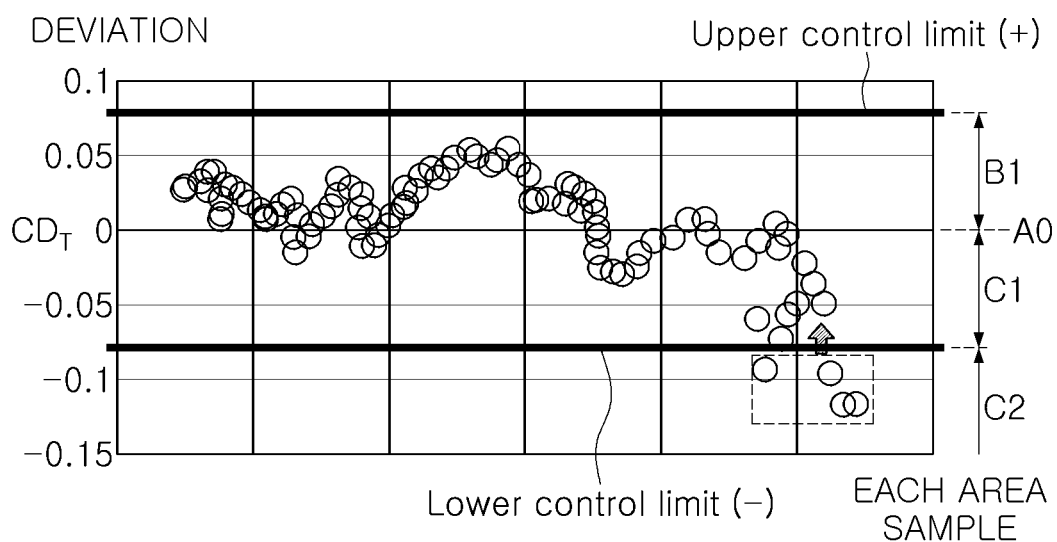
FIG. 6 is a graph illustrating a critical dimension distribution of pattern elements of a photomask.

FIG. 5 is a plan diagram illustrating a critical dimension gradient of pattern elements of a photomask. FIG. 6 is a graph illustrating a critical dimension distribution of pattern elements of a photomask.

FIG. 5 illustrates an upper surface of a photomask in which a plurality of pattern areas are arranged. A plurality of pattern elements may be arranged in each of the pattern areas. The terms A0, B1, C1, and C2 may indicate areas divided according to critical dimensions (e.g., a distance between adjacent patterns).

As illustrated in FIG. 6, the pattern areas disposed in AO may have pattern elements arranged with a target distance therebetween, and the pattern areas disposed in B1 and C1 may have pattern elements that deviate from the target distance such that the deviation does not exceed a control limit, and is therefore within an allowable range (e.g., ±0.08). The pattern areas disposed in C2 may include patterns arranged with a distance of which a deviation from the target distance is beyond an allowable range (e.g., −0.08). In this case, local correction of a critical dimension (CD) may be required for the pattern areas disposed in the C2 area.

Figure 7:
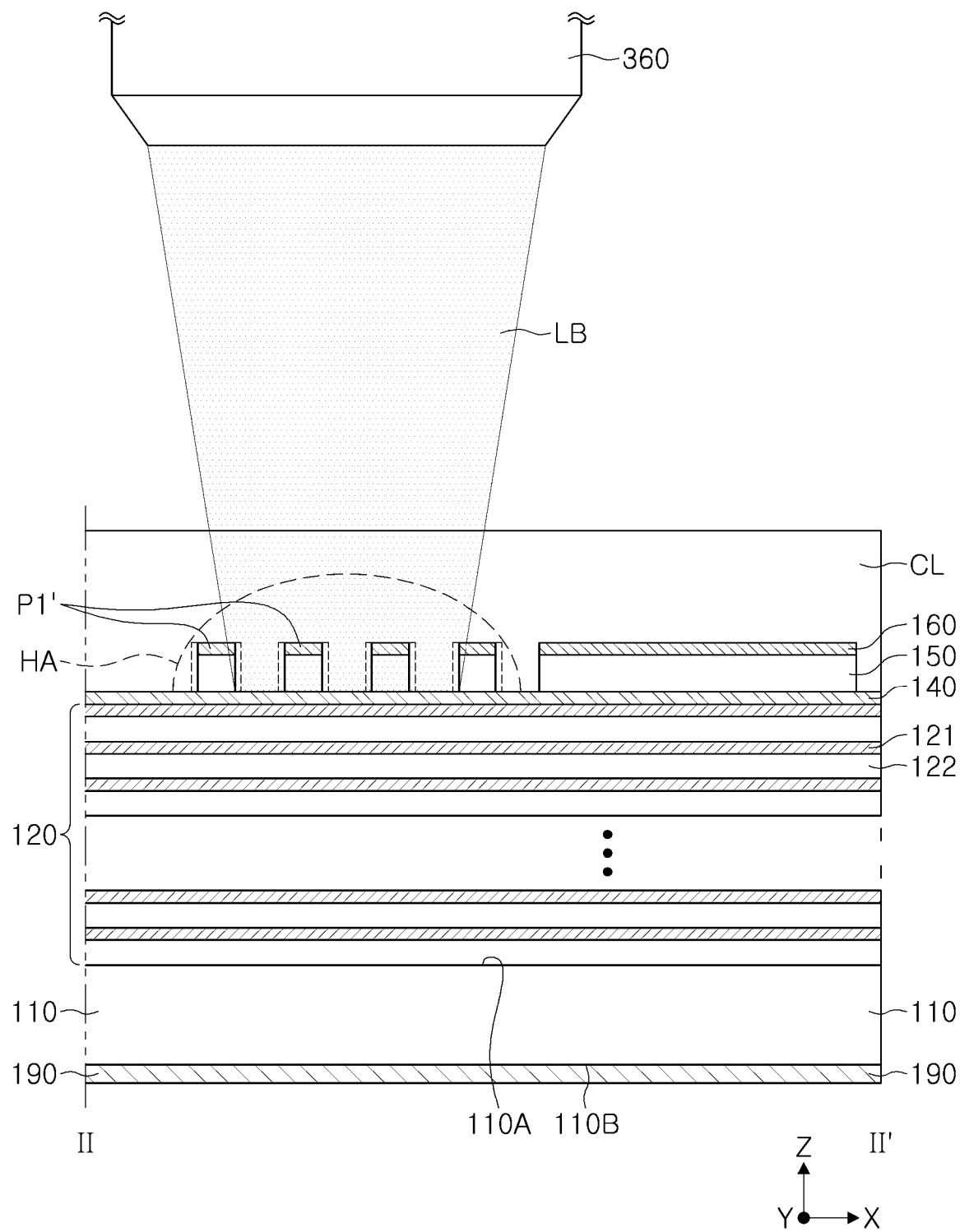
FIG. 7 is a cross-sectional diagram illustrating a process of locally correcting an EUV photomask.

Referring back to FIG. 1, in process S16, a chemical liquid CL (e.g., an etchant) may be applied to the photomask 100, and in process S18, a laser beam LB may be irradiated to the correction target area PA1' while the chemical liquid CL is provided on the photomask 100. FIG. 7 is a cross-sectional diagram illustrating a process of locally correcting an EUV photomask in which the laser beam LB is irradiated to the correction target area PA1' while the chemical liquid CL is provided on the photomask 100. As shown, the temperature in area HA may be increased by the laser beam LB.

In the local correction of a CD in an example embodiment, the laser beam LB may be irradiated to the correction target area PA1' in a state in which the chemical liquid LC is provided on the pattern elements of the photomask 100, and the temperature of the chemical liquid may locally increase in the area to which the beam has been irradiated.

$$k = Ae^{\frac{-E}{RT}}$$

(k: a reaction rate constant, A and E: intrinsic numerical constants according to a reactant, R: a gas constant, T: an absolute temperature)

As in the Arrhenius equation above, the increase of temperature of the chemical liquid may increase an etch rate led by the chemical reaction. Local etching may be induced in the correction target area PA1' through the laser beam LB, and the CD of the correction target area PA1' may be selectively corrected.

In an example embodiment, to increase precision of the local etching by the laser beam, the wavelength of the laser beam may not be absorbed by the chemical liquid. Rather, the wavelength of the laser beam may be absorbed by the correction target area of the photomask to increase the temperature of the correction target area. The laser beam employed in an example embodiment may have a wavelength in which the laser beam may not be absorbed by the chemical liquid.

Figure 8:
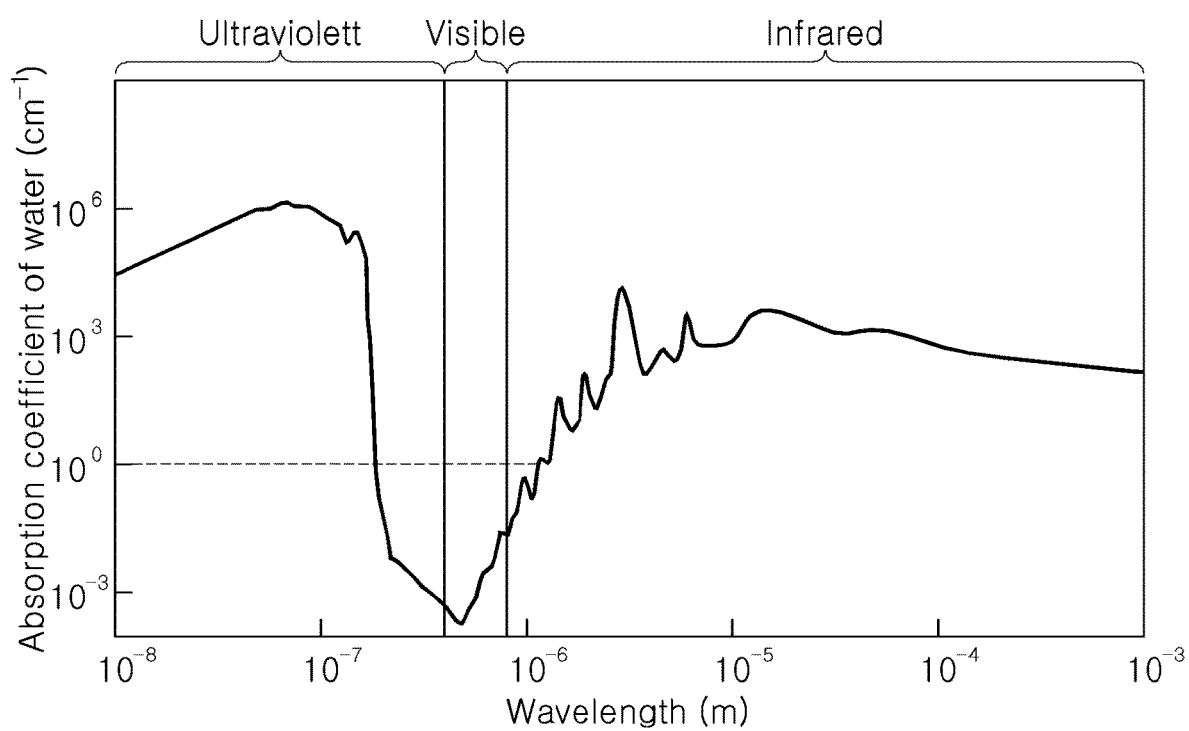
FIG. 8 is a graph illustrating a water absorption rate depending on a wavelength of a laser beam.

Specifically, FIG. 8 illustrates the absorption rate according to the wavelength of the laser beam based on water, which is a significant portion of the chemical liquid. When considering the wavelength absorption rate of water, to maintain the level of absorption rate of the chemical liquid to be 10° (1/m) or lower, the wavelength of the laser beam employed in an example embodiment may range from about 200 nm to about 700 nm. In other example embodiments, the wavelength of the laser beam may range from about 400 nm to about 600 nm. For example, the laser beam may be implemented by a KrF, XeCl, ArF, KrCl, Ar, YAG, or $CO_2$ laser beam.

As described above, in the process of CD correction in an example embodiment, by performing the local etching by irradiating the laser beam LB to the correction target area PA1', the distance d2 between the correction target pattern elements P1' may increase (or the width w2 may be decreased) as illustrated in FIG. 7. The deviation from the target distance between the correction target pattern elements P1' in the C2 area may be reduced such that the correction target pattern elements P1' may be corrected to be within the allowable range (see the portion indicated by an arrow in FIG. 6).

When the correction target area includes multiple pattern areas (e.g., a plurality of correction target areas), the CD correction for the plurality of correction target areas may be performed by, after completing the CD correction of one correction target area, moving the position to which the laser beam is irradiated to the other correction target area and repeating the process of irradiating the laser beam.

Figure 9:
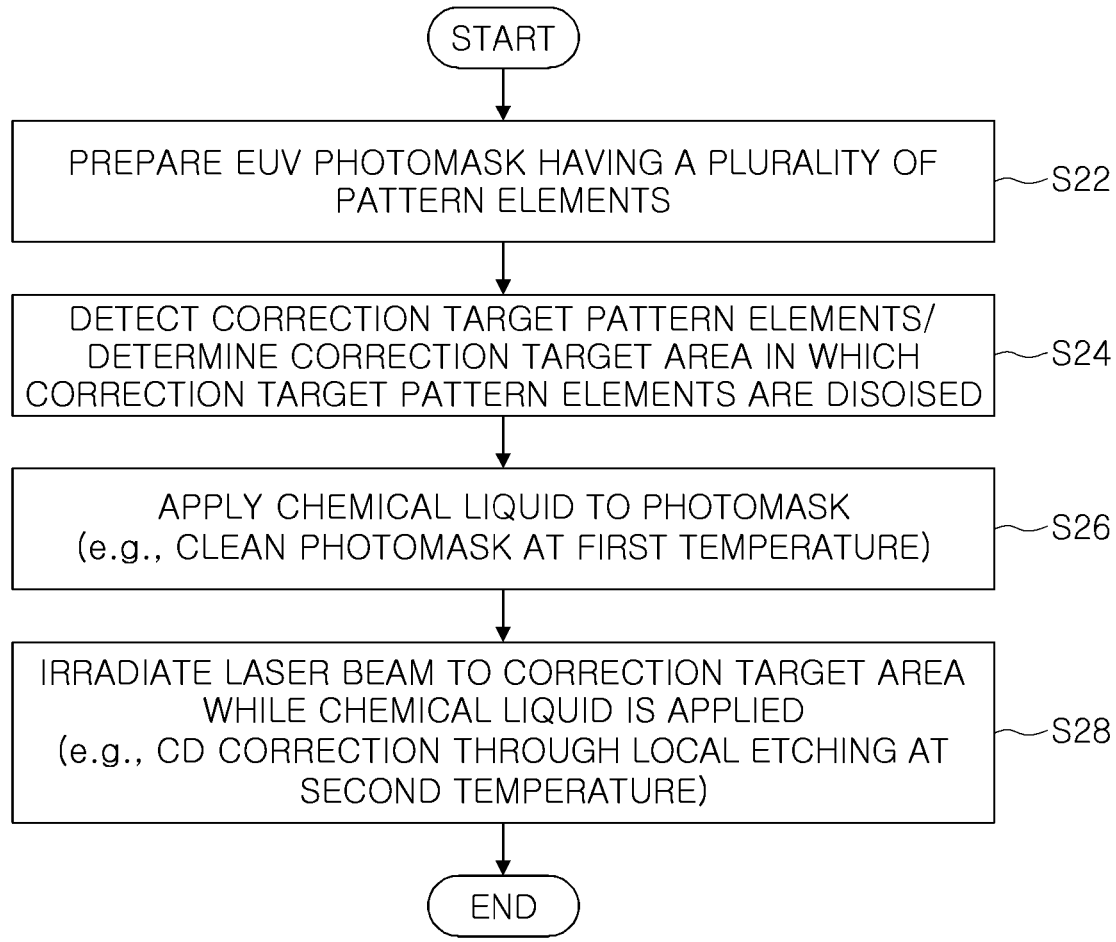
FIG. 9 is a flowchart illustrating a method of correcting an EUV photomask according to an example embodiment.

FIG. 9 is flowchart illustrating a method of correcting an EUV photomask according to an example embodiment. For example, the method of correcting the photomask in an example embodiment may be performed in conjunction with a process of cleaning the photomask.

The method of correcting the photomask in an example embodiment may begin with a process S22 of preparing an EUV photomask having a plurality of pattern elements.

The process of preparing the EUV photomask having the plurality of pattern elements may correspond to the partial processes S11 and S12 of the process of manufacturing the photomask described above. The plurality of pattern elements may be configured to have a desired target critical dimension (a width and/or a distance). The plurality of pattern elements may include correction target pattern elements having a critical dimension different from a target critical dimension according to distribution of a process set.

In process S24, correction target pattern elements may be detected, and an correction target area in which the correction target pattern elements are disposed may be determined.

Similarly to the process S14 of the process of manufacturing the photomask in the aforementioned example embodiment, normal pattern elements may be detected by measuring a width and distance of the plurality of pattern elements, and a correction target area, having dimensions that deviate from an allowable range of the critical dimension, may be determined. For example, when the plurality of pattern elements having a first width are formed by etching the light absorbing layer, correction target pattern elements having a second width greater than the first width may be detected, and the areas of which a deviation is beyond the allowable range may be determined as correction target areas. Similarly, when the plurality of pattern elements are configured to be arranged with a first distance, the correction target area may be determined as an area in which correction target pattern elements having a second distance smaller than the first distance are arranged.

A chemical liquid may be applied to the photomask in process S26 at a first temperature.

In this process, the chemical liquid may act as a cleaning liquid for the photomask at the first temperature (e.g., room temperature). The chemical liquid may remove residual foreign matters after the pattern elements are formed by etching the light absorbing layer at the first temperature. The cleaning process may be performed in a "dynamic environment" to increase cleaning efficiency. For example, in the cleaning process, the chemical liquid may be sprayed onto and may flow on the surface of the photomask, an object to be cleaned. Also, the photomask may be configured to rotate during the cleaning process in which the chemical liquid is sprayed.

The chemical liquid employed in an example embodiment may include at least one of aqueous ammonia ($NH_4OH$) and tetramethylammonium hydroxide (TMAH). For example, the chemical liquid may include a mixture of ammonium hydroxide ($NH_3OH$), hydrogen peroxide ($H_2O_2$), and ultrapure water ($H_2O$), a mixture of ammonia ($NH_3$), deionized water, and ultrapure water including carbon dioxide.

In process S28, the CD correction may be performed through local etching by irradiating a laser beam to the correction target area while the chemical liquid is provided on the photomask.

Similarly to the aforementioned example embodiment, the laser beam may have a wavelength of a range of 200 nm to 700 nm so as to be directly irradiated to the correction target area instead of being absorbed by the chemical liquid. A temperature of the correction target area of the photomask to which the laser beam is irradiated may increase to a second temperature higher than the first temperature. The chemical liquid adjacent to the correction target area may have an increased etch rate at the increased second temperature, and may thereby etch the correction target pattern elements at the increased etch rate. In the other area to which the laser beam is not irradiated, the first temperature may be maintained, whereas in the correction target area, the correction target pattern elements may be etched at the second temperature increased by the laser beam. In this etching process, the width of the correction target pattern elements may be reduced and the distance therebetween may increase, thereby performing the process of local CD correction.

This etching process may be performed in a "static environment" to compensate for local temperature control. For example, the supply of the chemical liquid from the nozzle may be stopped, and the local etching process may be performed by irradiating a laser beam using a chemical liquid statically remaining on the surface of the photomask (see FIG. 10). In another example embodiment, the local etching process may be performed by irradiating a laser beam after immersing the photomask in a chemical liquid stored in a bath.

In the process of irradiating a laser beam, the correction target pattern elements may be etched by the chemical liquid such that the pattern elements may have a width having a reduced deviation from the first width. Similarly, the correction target pattern elements may be etched such that that the pattern elements may have a distance with a reduced deviation from the first distance.

Figure 10:
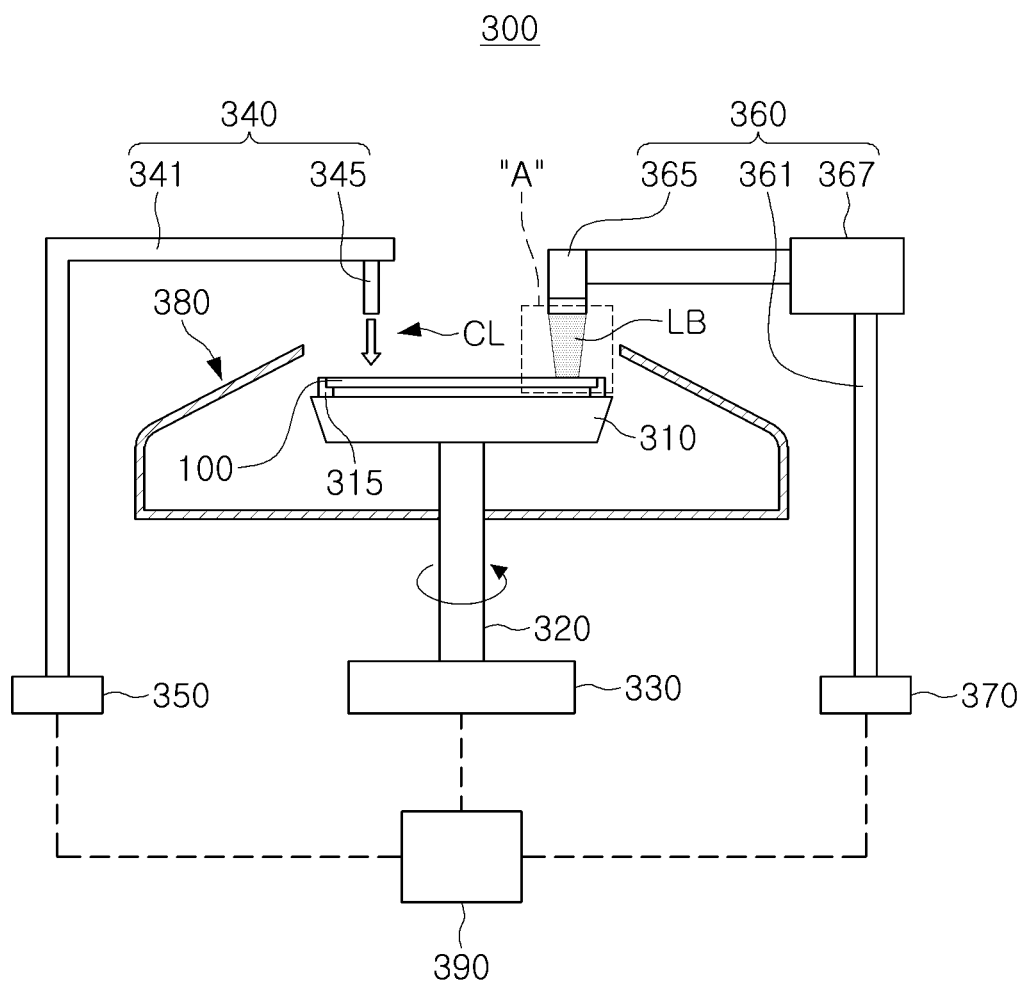
FIG. 10 is a cross-sectional diagram illustrating an apparatus for correcting an EUV photomask according to an example embodiment.
Figure 11:
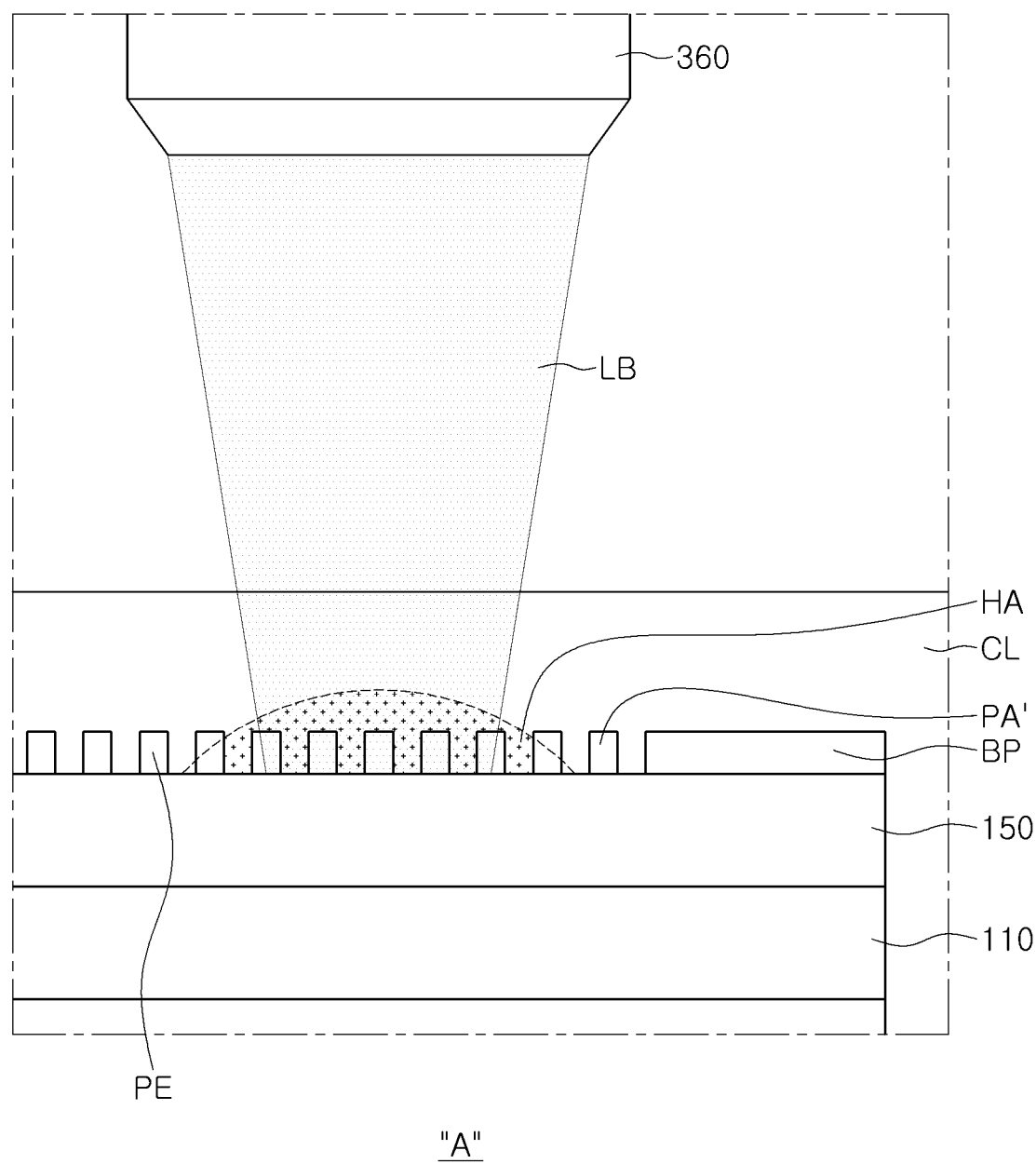
FIG. 11 is a process cross-sectional diagram illustrating a portion of the apparatus illustrated in FIG. 10.

FIG. 10 is a cross-sectional diagram illustrating an apparatus for correcting an EUV photomask according to an example embodiment. FIG. 11 is a process cross-sectional diagram illustrating portion "A" of the apparatus illustrated in FIG. 10

Referring to FIG. 10, the apparatus 300 for correcting the photomask in an example embodiment may include a support portion 310 configured to support the photomask 100, a chemical supply unit 340 configured to supply the chemical liquid CL to an upper surface of the photomask 100, a laser irradiation unit 360 configured to irradiate a laser beam LB to a partial area of the upper surface of the photomask 100, and a controller 390 configured to control the chemical supply unit 340 and the laser irradiation unit 360.

A plurality of pattern elements may be arranged on the upper surface of the photomask 100, as illustrated in FIGS. 4A and 4B, and the chemical supply unit 340 and the laser irradiation unit 360 may be configured to be directed to the upper surface of the photomask 100. For example, the chemical supply unit 340 may be configured to spray a chemical liquid onto the upper surface of the photomask 100, and the laser irradiation unit 360 may be configured to irradiate the laser beam LB to the upper surface of the photomask 100. For example, the laser beam LB may be irradiated to portions of the upper surface that corresponding to the correction target area.

The controller 390 may be connected to the chemical supply unit 340 and the laser irradiation unit 360 to control the spraying of the chemical liquid CL of the chemical supply unit 340 and the irradiation of the laser beam LB of the laser irradiation unit 360.

As illustrated in FIG. 11, the controller 390 may determine the area in which the correction target pattern elements having a critical dimension different from a target critical dimension among the plurality of pattern elements PE are arranged as the correction target area PA', and may drive the laser irradiation unit 360 to irradiate the laser beam LB to the correction target area PA' while the chemical liquid CL is supplied. Also, the controller 390 may be configured to stop the supply of the chemical liquid CL of the chemical supply unit 340 and to irradiate the laser beam LB to the correction target area PA'.

The chemical supply unit 340 may include a chemical supply line 341 and a chemical nozzle 345. Chemicals stored in a chemical supply source may be supplied to the chemical nozzle 345 through the chemical supply line 341. The chemical supply unit 340 may include a valve for opening and closing the chemical supply line 341 on the chemical supply line 341.

The laser irradiation unit 360 may include a laser light source 365, a laser moving arm 367 connected to the laser light source 365, and a support portion 361 configured to support the laser moving arm 367. The laser light source 365 may be configured to irradiate a laser beam LB having a wavelength not absorbed by the chemical liquid CL. In example embodiments, the laser light source 365 may be configured to irradiate a laser beam LB having a wavelength of a range of 200 nm to 700 nm. For example, the laser beam may be implemented by a KrF, XeCl, ArF, KrCl, Ar, YAG, or CO2 laser beam. The laser moving arm 367 may move the laser light source 365 to change the position to which the laser beam LB is irradiated by the laser driving unit 370. The laser moving arm 367 may be configured to move in a horizontal direction parallel to the upper surface of the photomask 100, and also in a vertical direction to adjust the area of the laser beam LB.

The laser irradiation unit 360 may include an optical system for adjusting the position to which the laser beam LB is irradiated and an area of the laser beam LB. The controller 390 may control the supply of the chemical liquid, the position to which the laser beam LB is irradiated, and the area of the laser beam LB through the chemical nozzle driving unit 350 and the laser irradiation unit 360.

The apparatus 300 for correcting the photomask in an example embodiment may include a support portion 320 for supporting the photomask 100, and a container 380 providing an internal space in which the cleaning and the correction (etching) are performed.

The container 380 may prevent the chemical liquid used in the cleaning and etching processes and the material created in the processes from leaking to an external area. The support portion 320 may be disposed in the internal surface of the container 380 and may support the photomask 100 during the processes. The support portion 320 may include a guide structure 315 for supporting the photomask 100.

The apparatus 300 for correcting the photomask in an example embodiment may include a support shaft configured to rotate the support portion 320 and a support driving unit 330 to rotate the support shaft. The support driving unit 330 may be controlled by the controller 390. The support driving unit 330 may include a function of moving up and down to move in a vertical direction with reference to the container 380 such that a relative height of the support portion 310 may be adjusted. By using the function of moving up and down, the photomask 100 may be loaded on the support portion 310 or may be unloaded from the support portion 310. In example embodiments, instead of moving up the support portion 310, the container 380 may be configured to move up and down.

As described above, the chemical liquid CL employed in an example embodiment may be configured to perform the cleaning process at a first temperature and to etch (correct) the correction target pattern elements at a second temperature increased by the laser beam LB. Because the area HA of which the temperature increases to the second temperature by the laser beam LB is limited to the area adjacent to the correction target area PA' to which the laser beam LB is irradiated, the desired area may be precisely and locally corrected. For example, the chemical liquid CL may include a mixture of ammonium hydroxide, hydrogen peroxide, and ultrapure water, a mixture of ammonia and deionized water, and ultrapure water to which carbon dioxide is added.

The apparatus 300 for correcting the photomask illustrated in FIG. 10 may be used as a correction apparatus for implementing the correction method combined with the cleaning of the photomask described in FIG. 9.

In the cleaning process, the controller 390 may control the chemical supply unit 340 to spray the chemical liquid CL onto the photomask 100, and control rotation of the photomask 100 through the support driving unit 330 during the spraying. In the process of CD correction, the controller 390 may stop the supply of the chemical liquid CL and the rotation of the photomask 100, and may perform the desired CD correction by irradiating the laser beam LB to the correction target area PA'.

Figure 12:
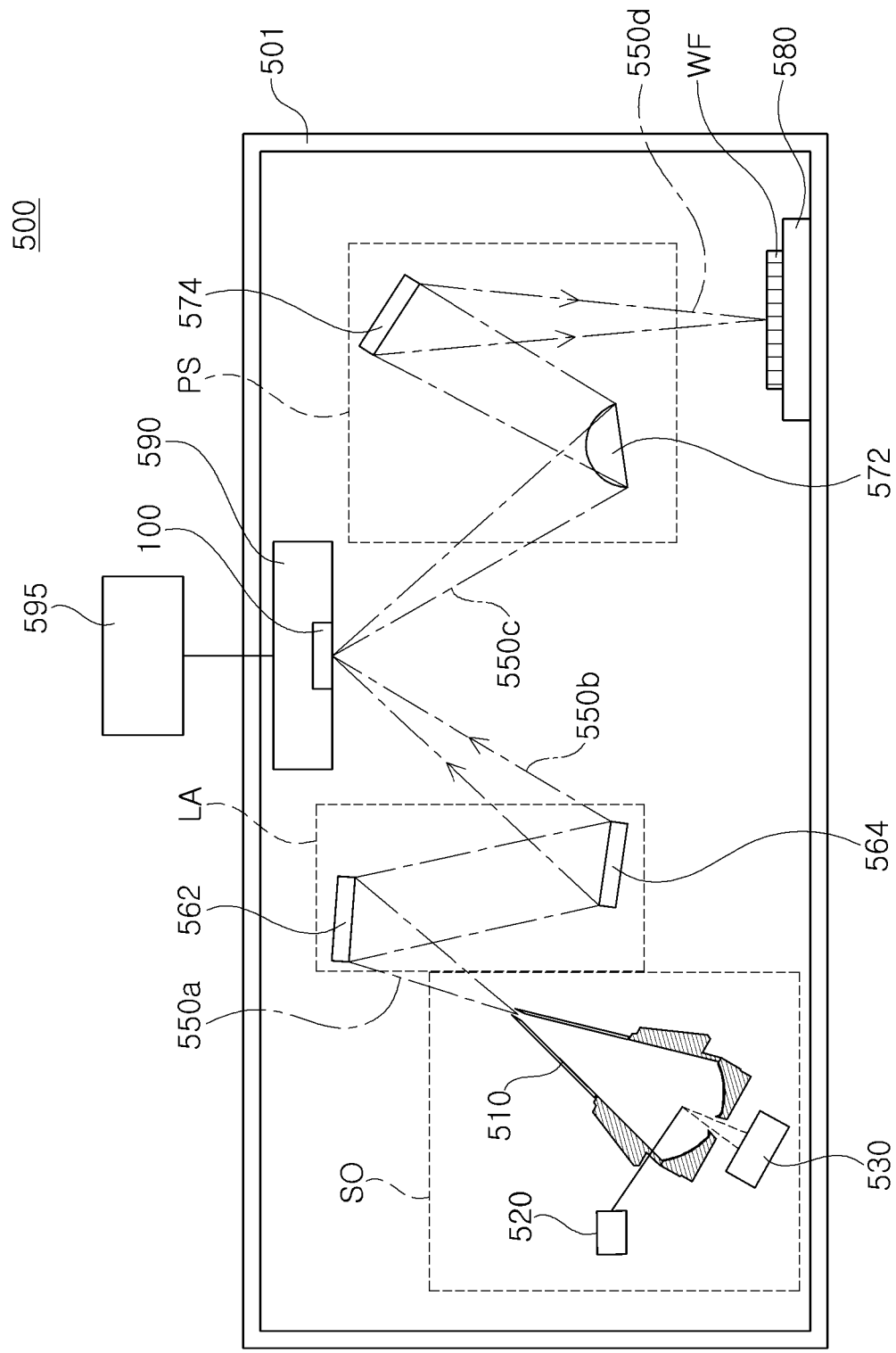
FIG. 12 is a diagram illustrating a photolithography process facility to which an EUV photomask may be employed according to an example embodiment.

FIG. 12 is a diagram illustrating a photolithography process facility to which an EUV photomask may be employed according to an example embodiment.

Referring to FIG. 12, an EUV photolithography process facility 500 in an example embodiment may include an exposure chamber 501, an EUV light source system SO, a lithographic apparatus LA, a projection system PS, a mask stage 590 on which the photomask 100 is mounted, and a wafer stage 580 on which the semiconductor wafer WF is mounted.

The wafer stage 580 may move the semiconductor wafer WF to change the exposed area of the semiconductor wafer WF.

The exposure chamber 501 may include an internal space in which the EUV source system SO, the lithographic apparatus LA, the projection system PS, the mask stage 590, and the wafer stage 580 are disposed. In example embodiments, a portion of the components may be disposed on an external area of the exposure chamber 501. For example, a portion of the light source system SO may be disposed externally of the exposure chamber 501.

In the mask stage 590, the photomask 100 may be fixed to the mask stage 590 by an electrostatic force formed by power applied from the power supply unit 595. The semiconductor wafer WF may be loaded/unloaded onto the wafer stage 580.

The internal space of the exposure chamber 501 may be in a low pressure state or a vacuum state to prevent first light 550a of EUV generated by the EUV light source system SO from being absorbed by the gas. For example, the EUV may have a wavelength between about 4 nm and about 124 nm. In example embodiments, the EUV may have a wavelength between about 4 nm and about 20 nm. In an example, the EUV may have a wavelength of about 13.5 nm.

The EUV light source system SO may include a light source chamber 510, an EUV light source unit 530 which is a driver light source, and a droplet supply unit 520. The EUV light source system SO may generate EUV light of a wavelength of less than about 100 nm. The EUV light source unit 530 may be configured as, for example, a plasma source. Also, the plasma light source may be a laser-produced plasma (LPP) light source which may target a droplet formed of one of tin (Sn), lithium (Li) and xenon (Xe) using a $CO_2$ laser as an excitation light source. The EUV light source system SO in an example embodiment may use a master oscillator power amplifier (MOPA) method. In other words, a pre-pulse and a main pulse may be generated using a seed laser, a pre-pulse may be irradiated to the droplet, and the main pulse may be irradiated to the droplet, and using the plasma generated therefrom, EUV light may be emitted.

In the light source chamber 510 of the EUV light source system SO, a plasma may be formed by 50,000 collisions that occur per second between a laser supplied by the EUV light source unit 530 and droplets supplied by the droplet supply unit 520. A collector of the light source chamber 510 may collect EUV light radiated from the plasma in all directions, may concentrate the light on a front area, and may provide the light to the lithographic apparatus LA.

The lithographic apparatus LA may include a plurality of mirrors, and may allow EUV first light 550a emitted from the EUV light source system SO to pass through the lithographic apparatus LA and be emitted as second light 550b. The second light 550b from the lithographic apparatus LA may be irradiated toward the surface of the photomask 100 of the mask stage 590. As for the plurality of mirrors included in the lithographic apparatus LA, only two mirrors 562 and 564 are illustrated for ease of description, but example embodiments are not limited thereto, and an optical system may include a greater number of mirrors or only a single mirror.

The projection system PS may include a plurality of mirrors to allow EUV third light 550c reflected from the photomask 100 to pass therethrough and be emitted as fourth light 550d. The fourth light 550d having passed through the projection system PS may be irradiated to the semiconductor wafer WF on the wafer stage 580 and may expose a photoresist layer on the surface of the semiconductor wafer WF. As for the plurality of mirrors included in the projection system PS, only two mirrors 572 and 574 are illustrated for ease of description, but example embodiments are not limited thereto, and an optical system may include a greater number of mirrors or only a single mirror.

Figure 13:
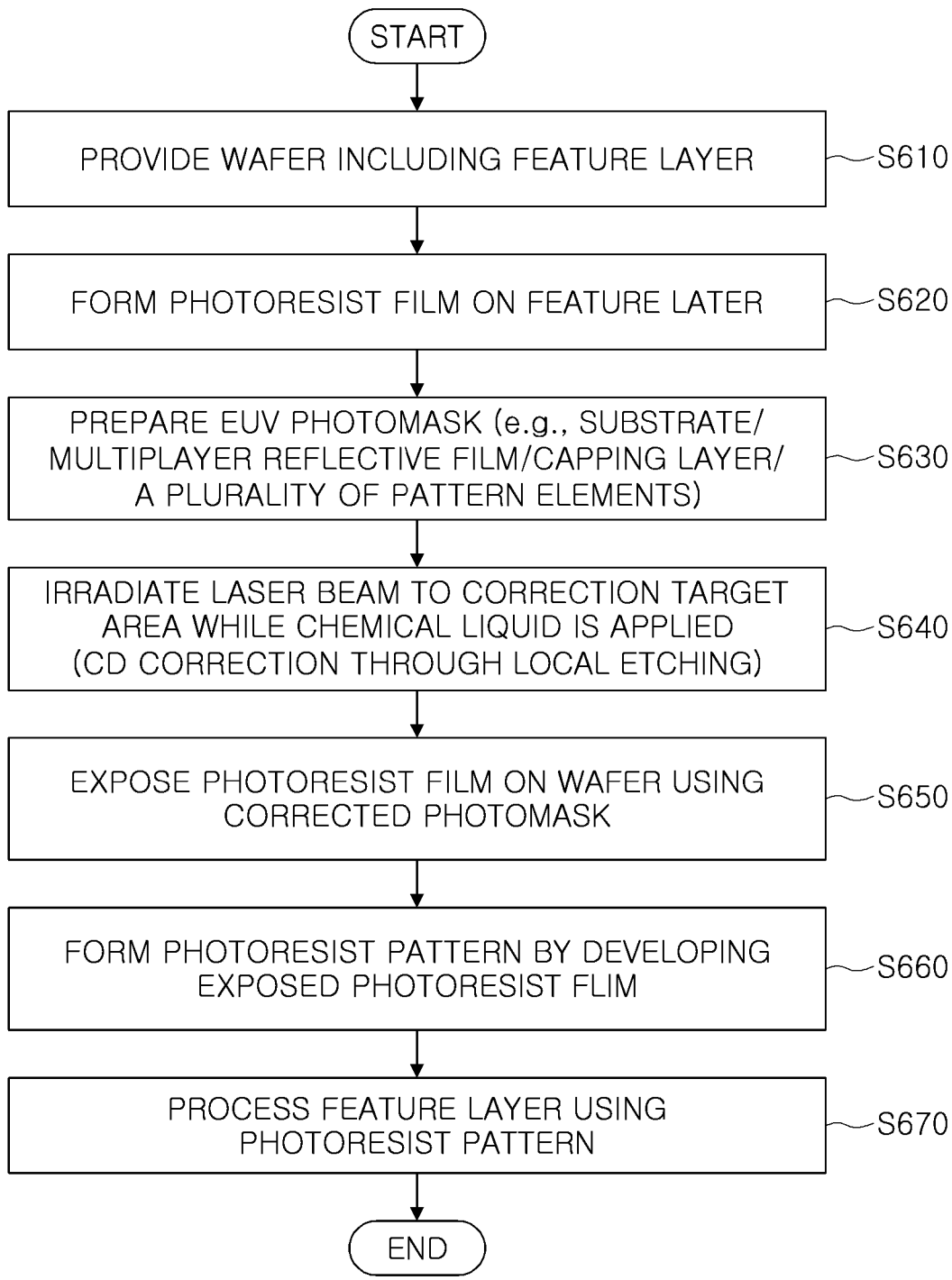
FIG. 13 is a flowchart illustrating a method of manufacturing a semiconductor device according to an example embodiment.

FIG. 13 is a flowchart illustrating a method of manufacturing a semiconductor device according to an example embodiment.

In process S610, a wafer WF (in FIG. 12) including a feature layer may be provided.

In example embodiments, the feature layer may be configured as a conductive layer or an insulating layer formed on a wafer. For example, the feature layer may be formed of a metal, a semiconductor, or an insulating material. In example embodiments, the feature layer may be a portion of the wafer.

In process S620, a photoresist film may be formed on the feature layer.

In example embodiments, the photoresist layer may be formed of a resist material for EUV (135 nm). In example embodiments, the photoresist layer may be formed of a resist for an $F_2$ excimer laser (157 nm), a resist for an ArF excimer laser (193 nm), or a resist for a KrF excimer laser (248 nm). The photoresist layer may be formed of a positive photoresist or a negative photoresist.

In example embodiments, to form the photoresist film formed of the positive photoresist, a photosensitive polymer having an acid-labile group, a potential acid, and a photoresist composition including a solvent may be spin-coated on the feature layer.

In example embodiments, the photosensitive polymer may include a (meth)acrylate-based polymer. The (meth)acrylate-based polymer may be an aliphatic (meth)acrylate-based polymer. For example, the photosensitive polymer may be polymethylmethacrylate (PMMA), poly(t-butylmethacrylate), poly(methacrylic acid), poly(norbornylmethacrylate), a binary or terpolymer of repeating units of the (meth)acrylate-based polymers, or a mixture thereof.

Also, the photosensitive polymers described above may be substituted with various acid-labile protecting groups. The protecting group may consist of t-butoxycarbonyl (t-BOC), tetrahydropyranyl, trimethylsilyl, phenoxyethyl, cyclohexenyl, tert-butoxycarbonylmethyl, tert-butyl, adamantly, or norbornyl group. However, example embodiments are not limited thereto.

In example embodiments, the potential acid may be formed of a photoacid generator (PAG), a thermoacid generator (TAG), or a combination thereof. In example embodiments, the PAG may be formed of a material which may generate an acid by being exposed to one material selected from among EUV light (1-31 nm), $F_2$ excimer laser (157 nm), ArF excimer laser (193 nm), and KrF excimer laser (248 nm). The PAG may be formed of onium salt, a halogen compound, nitrobenzyl esters, alkyl sulfonates, diazonaphthoquinones, iminosulfonates, disulfones, diazomethanes, sulfonyloxyketones, and the like.

In process S630, an EUV photomask may be prepared. Similarly to the aforementioned example embodiment, the EUV photomask may include a substrate, a reflective layer for reflecting EUV light on the substrate, and a plurality of pattern elements formed of a light absorber.

The plurality of pattern elements may include pattern elements having a critical dimension different from a target critical dimension and correction target pattern elements which deviate from an allowable range according a deviation of the critical dimension. The correction target pattern elements may be distributed locally throughout the entire area of the photomask. For example, the correction target pattern elements may have a pattern width smaller than a target pattern width of the plurality of pattern elements. Alternatively, the correction target pattern elements may be arranged with a distance greater than a target distance of the plurality of pattern elements. The area in which the correction target pattern elements are disposed may be determined as the correction target area (see S14 in FIG. 1).

In process S640, CD correction may be performed by irradiating a laser beam to a correction target area of the photomask while a chemical liquid is provided on the photomask.

The CD correction process may be performed while a chemical liquid is provided on the photomask. A temperature of the correction target area to which the laser beam is irradiated in the photomask may increase such that an reaction rate with the surrounding chemical liquid may increase, etching may occur, and the critical dimension of the correction target pattern elements may be corrected by adjusting the etching.

Specifically, the correction target pattern elements may be etched by the chemical liquid such that the pattern elements may have a width having a reduced deviation from the target width, or a deviation from the target distance may be reduced. As described above, because the local CD correction may be precisely controlled, the overall critical dimension CD distribution of the EUV photomask may improve.

In process S650, the photoresist film formed in the process S620 in the photolithography system illustrated in FIG. 12 may be exposed using the photomask corrected according to the process S640.

In example embodiments, in the exposure process, the photoresist layer may be exposed using EUV light reflected from the photomask corrected in the process S640. In the exposure process, the photoresist layer may be exposed using EUV light reflected from multiple reflective layers of the corrected photomask, the reflective layer 120 of the photomask 100 illustrated in FIG. 4A, for example.

In process S660, the exposed photoresist layer may be developed to form a photoresist pattern, and in process S670, the feature layer may be processed using the photoresist pattern. In example embodiments, to process the feature layer according to the process S670, a fine feature pattern may be formed by etching the feature layer using the photoresist pattern as an etching mask.

In example embodiments, to process the feature layer according to the process S670, impurity ions may be implanted into the feature layer using the photoresist pattern as an ion implantation mask. Also, in other example embodiments, to process the feature layer according to the process S670, a process film may be formed on the feature layer exposed through the photoresist pattern formed in the process S660. The process film may be formed of any one or any combination of a conductive film, an insulating film and a semiconductor film.

According to the aforementioned example embodiments, by locally irradiating a laser beam to the EUV photomask in a chemical liquid environment, the critical dimension (CD) of an optical absorber pattern to be corrected disposed in the corresponding area may be controlled with precision through thermal energy formed by the laser. Accordingly, the distribution of the critical dimension of the EUV photomask may improve.

While example embodiments have been illustrated and described above, it will be apparent to those skilled in the art that modifications and variations could be made without departing from the scope as defined by the appended claims and their equivalents.

What is claimed is:

1. A method comprising:
preparing a mask blank, the mask blank comprising a substrate, a reflective layer disposed on the substrate for reflecting extreme ultraviolet light, and a light absorbing layer disposed on the reflective layer;
providing a photomask by forming a plurality of pattern elements having a target critical dimension from the light absorbing layer, wherein the plurality of pattern elements comprise a correction target pattern element to be corrected, and the correction target pattern element has a critical dimension different from the target critical dimension;
identifying a portion of the photomask in which the correction target pattern element is disposed as a correction target area;
applying an etchant to the photomask; and
locally irradiating a laser beam to the correction target area while the etchant is provided on the photomask.

2. The method of claim 1, wherein the laser beam has a wavelength not absorbed by the etchant.

3. The method of claim 2, wherein the wavelength of the laser beam is between 200 nm and 700 nm.

4. The method of claim 1, wherein the laser beam is selected from a group consisting of KrF, XeCl, ArF, KrCl, Ar, YAG, and $CO_2$ laser beams.

5. The method of claim 1, wherein the locally irradiating the laser beam to the correction target area comprises partially etching the correction target pattern element to reduce a deviation of the critical dimension of the correction target pattern element from the target critical dimension.

6. The method of claim 1, wherein the correction target pattern element has a width greater than a width of the target critical dimension.

7. The method of claim 1, wherein the etchant comprises any one or any combination of aqueous ammonia (NH4OH) and tetramethylammonium hydroxide (TMAH).

8. The method of claim 1, wherein the correction target area comprises a plurality of correction target areas, and
wherein the locally irradiating the laser beam to the correction target area comprises locally irradiating the laser beam to one correction target area among the plurality of correction target areas, moving a position to which the laser beam is irradiated to another correction target area among the plurality of correction target areas, and locally irradiating the laser beam to the other correction target area.

9. The method of claim 1, wherein the mask blank further comprises a capping layer interposed disposed between the reflective layer and the light absorbing layer.

10. The method of claim 1, wherein the reflective layer comprises a silicon film and a metal film alternately stacked.

11. A method comprising:
preparing a mask blank, the mask blank comprises a substrate, a reflective layer disposed on the substrate for reflecting extreme ultraviolet light, and a light absorbing layer disposed on the reflective layer;
providing a photomask by forming a plurality of pattern elements having a first width from the light absorbing layer, wherein the plurality of pattern elements comprise correction target pattern elements to be corrected, and the correction target pattern elements have a second width greater than the first width;
identifying a portion of the photomask in which the correction target pattern elements are disposed as a correction target area;
applying a chemical liquid to the photomask; and
locally irradiating a laser beam having a wavelength between 200 nm and 700 nm to the correction target area while the chemical liquid is provided on the photomask,
wherein, in the locally irradiating the laser beam to the correction target area, the correction target pattern elements are etched by the chemical liquid to reduce deviation of the second width from the first width.

12. The method of claim 11, wherein the wavelength of the laser beam is between 400 nm and 600 nm.

13. The method of claim 11, wherein the plurality of pattern elements are arranged with a first distance therebetween, and the correction target pattern elements are arranged with a second distance smaller than the first distance therebetween, and
wherein, in the locally irradiating the laser beam to the correction target area, the second distance between the correction target pattern elements increases to reduce the deviation of the second distance from the first distance is reduced.

14. The method of claim 11, wherein the applying the chemical liquid to the photomask is performed at a first temperature, and the chemical liquid acts as a cleaning liquid for cleaning the photomask at the first temperature.

15. The method of claim 14, wherein, in the locally irradiating the laser beam, a temperature of the chemical liquid adjacent to the correction target area to which the laser beam is locally irradiated increases from the first temperature to a second temperature, and the chemical liquid acts as an etchant for etching the correction target pattern elements at the second temperature.

16. The method of claim 14, wherein the providing the photomask comprises forming an align pattern from the light absorbing layer.

17. The method of claim 11, wherein the mask blank further comprises a capping layer interposed between the reflective layer and the light absorbing layer, and the reflective layer comprises a first material layer and a second material layer alternately stacked.

18. The method of claim 17, wherein the first material layer comprises silicon, and the second material layer comprises molybdenum (Mo).

19. The method of claim 11, wherein the mask blank further comprises an anti-reflective film disposed on the light absorbing layer.

* * * * *